July 14, 1964 J. K. MILLS ETAL 3,141,139
DIRECT-COUPLED TRANSISTOR OSCILLATOR HAVING VARIABLE SOURCE IMPEDANCE FOR CONTROLLING FREQUENCY
Filed Dec. 26, 1961 2 Sheets-Sheet 1

INVENTORS J. K. MILLS
F. P. ZUPA
BY Roy M. Porter, Jr.
ATTORNEY

INVENTORS J. K. MILLS
F. P. ZUPA
BY Roy M. Porter, Jr.
ATTORNEY

United States Patent Office 3,141,139

Patented July 14, 1964

3,141,139

DIRECT-COUPLED TRANSISTOR OSCILLATOR HAVING VARIABLE SOURCE IMPEDANCE FOR CONTROLLING FREQUENCY

John K. Mills, Morristown, N.J., and Frank P. Zupa, Bronx, N.Y., assignors to Bell Telephone Laboratories, Incorporated, New York, N.Y., a corporation of New York Filed Dec. 26, 1961, Ser. No. 162,287
4 Claims. (Cl. 331—45)

This invention relates to signal generating apparatus and more particularly to variable frequency transistor oscillators.

A general object of the present invention is to generate with a simple and economical circuit arrangement an alternating-current waveform whose frequency may be varied in response to changes in the magnitude of a single parameter.

A further object of the invention is to simultaneously generate at least three alternating-current signals, each being displaced from the other by a predetermined phase angle.

A still further object of the present invention is to generate signals whose waveshape may be altered by varying the magnitude of the interconnected circuit elements.

In a principal aspect, the present invention takes the form of a transistor oscillator arranged in the general configuration of a multistage, direct-coupled amplifier whose output is fed back to the input. Reactive impedance elements are interconnected with each transistor amplifying stage. As a result of the direct-coupled circuitry employed, it is a principal feature of the invention that the delay existing between the input and output signals of each stage is substantially altered whenever the magnitude of the supply voltage source impedance is changed. In consequence, the frequency of self-oscillation may be varied in response to changes in the source impedance. The interconnection of nonlinear resistance elements such as forward-biased diodes with the oscillator makes it possible to achieve a linear relationship between frequency and some parameter of the input energy over a wide frequency range.

A better understanding of the present invention and of the objects, features and advantages thereof may be gained from a consideration of the following detailed description which is presented in conjunction with the accompanying drawings, in which.

In preferred embodiments of the present invention, direct-coupled transistor circuitry is employed. The concept of direct-coupled transistor circuitry as a sufficient system for digital computers was disclosed by R. H. Beter, W. E. Bradley, R. B. Brown, and M. Rubinoff in an article entitled "Surface-barrier Transistor Switching Circuits" which appeared in the 1955 IRE Convention Record, part 4, pages 139–145. Further design considerations for direct-coupled transistor logic (dctl) circuits are disclosed in an article entitled "Transistor Characteristic for Direct-Couple Transistor Logic Circuits" by J. W. Easley and in a companion article entitled "Direct-Coupled Transistor Logic Circuitry" by J. R. Harris, both of which appeared in the IRE Transactions on Electronic Computers, vol. EC–7, No. 1, March 1958, pages 2–16.

Figure 1:
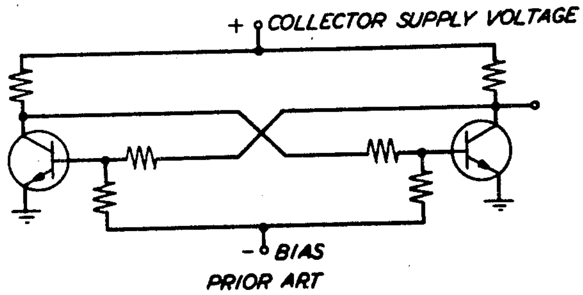
FIG. 1 is a schematic drawing of a well-known Eccles-Jordan flip-flop circuit.
Figure 2:
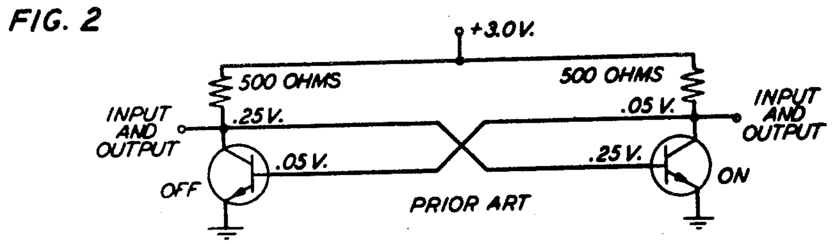
FIG. 2 is a schematic drawing of a "direct-coupled transistor logic" flip-flop.

In order to more clearly understand the operation of those illustrative embodiments of the invention described below, it will be helpful to first briefly consider the characteristics of a simple "dctl" flip-flop in contrast to the operation of a flip-flop circuit of more conventional design. In FIG. 1 of the drawings, a well-known Eccles-Jordan flip-flop is shown for reference. In this arrangement, when one of the two transistors is ON its collector electrode is at substantially ground potential. The base of the other transistor will therefore receive a slightly negative voltage from the voltage divider and will be turned OFF. FIG. 2 of the drawings illustrates a flip-flop circuit employing direct-coupled transistor circuitry. In contrast to the more conventional arrangement shown in FIG. 1, the dctl flip-flop has no voltage dividers and there is only a single voltage supply. It nevertheless acts like the conventional flip-flop with one transistor ON and the other OFF. If, as shown in FIG. 2, the right-hand transistor is ON, its collector voltage falls to about .05 volt and this potential is applied to the base of the left-hand transistor. This low positive voltage, while not sufficient to turn the left-hand transistor entirely OFF, is sufficiently near ground to substantially increase the transistor's trans-conductive impedance. The increased collector-emitter impedance of the left-hand transistor causes its collector voltage to rise to .25 volt and this voltage, when applied to the right-hand transistor maintains that transistor's ON condition.

In the arrangement shown in FIG. 2 it should be noted that the collector voltages are always quite small with respect to the positive supply voltage. This is due to the fact that, at any instance, the impedance from the collector of either transistor to ground is quite small with respect to the 500-ohm collector resistance. It should also be noted that the collector voltage of an ON transistor is much smaller than the base voltage.

Figure 3:
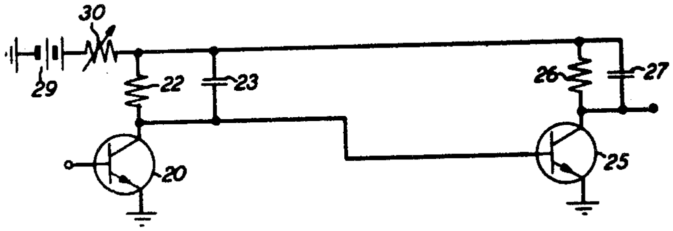
FIG. 3 illustrates the operation of a direct-coupled amplifying stage of the type employed in the invention.

FIG. 3 of the drawings illustrates a pair of direct-coupled transistor amplifying stages. The first amplifying stage comprises a transistor 20 whose emitter is grounded and whose collector electrode is connected to the parallel combination of resistance 22 and capacitor 23. The base electrode of transistor 20 forms the input to the amplifier. A similar amplifying stage made up of transistor 25, collector resistance 26, and capacitor 27 is "directly coupled" to the output of the first stage—the collector of transistor 20 being directly connected to the base of transistor 25. The positive collector supply voltage is obtained from a battery 29 by means of variable resistance 30.

If a sinusoidal signal were applied to the base electrode of transistor 20, it would be observed that the sinusoidal voltage appearing at the collector of transistor 25 is displaced from the input signal by a predetermined phase angle. This phase shift results from the fact that each amplifying stage exhibits a time lag which is related to the R.C. discharge time constant of the interconnected capacitors. The resistance through which capacitor 23 must discharge comprises resistance 22 in parallel with the series combination of resistance 30 and the "effective" resistance to ground seen at the collector of transistor 20. Since, as discussed above, this effective resistance is small compared to the value of the collector resistance 22, the R.C. time constant for each amplifying stage will be substantially affected by variations in the resistance 30. A decrease in the value of a resistance 30 therefore will decrease the time constant in both amplifier stages and, consequently, will decrease the phase displacement between the input and ouput signals.

Figure 4:
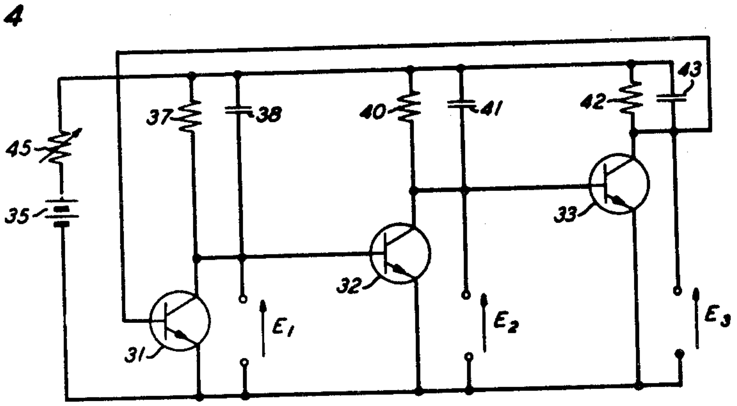
FIG. 4 is a schematic representation of an embodiment of the invention.

FIG. 4 of the drawings illustrates a variable frequency oscillator of the type contemplated by the present invention. The emitter electrodes of transistors 31, 32 and 33 are connected to the negative terminal of a battery 35. The collector electrode of transistor 31 is connected directly to the base of transistor 32 and also to the parallel combination of collector resistance 37 and capacitor 38. The collector of transistor 32 is connected to the base electrode of transistor 33 and to the parallel combination of collector resistance 40 and capacitor 41. The collector electrode of transistor 33 is connected both to the base of transistor 31 and to resistance 42 and capacitor 43 in parallel. The positive terminal of battery 35 is connected to each stage of the oscillator by means of a variable resistance 45.

The arrangement shown in FIG. 4 is capable of self-oscillation at a frequency which is inversely related to the value of resistance 45. In order to understand this characteristic of the oscillator, assume that transistor 31 is, in some manner, being turned ON. As transistor 31 turns ON, the voltage, $E_1$, at its collector drops. This voltage cannot drop instantaneously however since capacitor 38 must first be discharged. Transistor 32, therefore, will begin to turn OFF with a short-time lag following the turning ON of transistor 31. In a similar manner, transistor 33 will start to turn ON some time after transistor 32 starts to turn OFF. The voltage $E_3$ at the collector of transistor 33 then drops and transistor 31, which was formerly being turned ON now starts to turn OFF. This cycle repeats such that the voltages $E_1$, $E_2$ and $E_3$ exhibit sinusoidal fluctuations, each displaced 120 degrees from the other. The frequency at which the arrangement oscillates will be determined by the R.C. time constant of each of the three stages. Since the time constant of all three stages may be varied simultaneously by changing the magnitude of resistance 45, the frequency of oscillation may thereby be adjusted.

In discussing the operation of the oscillator shown in FIG. 4 of the drawings, it has been assumed that resistances 37, 40 and 42 as well as the value of capacitors 38, 41 and 43 are all of equal value. When this condition is met the output voltages from the oscillator are substantially pure sinusoids having a low harmonic content and are each displaced one from the other by equal phase angles. By altering the element values of the stages, it is possible to generate nonsinusoidal signals or to generate sinusoids having nonequal phase displacements.

It will, of course, be apparent to those skilled in the art that modifications of the oscillator shown in FIG. 4 of the drawings may be made without destroying circuit operation. For instance, it may be noted that capacitors 38, 41, and 43 are connected at a common point or "node" in a Y configuration. This node may be left unconnected or may be connected at other points in the circuit. Similarly, an equivalent "delta" network may replace the Y configuration shown in the drawings. As before, individual element values may be altered in order to provide the desired output waveforms or phase displacements. Furthermore, the circuit may be extended to any odd number of stages beyond the three-stage arrangement shown in FIG. 4. Since the total phase displacement around the ring must be 360°, if equal resistor and capacitor values are used, each stage will shift the phase by $$\frac{360^\circ}{n}$$

where $n$ is the number of stages. It should also be noted that for some high frequency applications, the capacitors will not be necessary since the inherent capacity of each stage will be sufficient to support self-oscillation.

Figure 5:
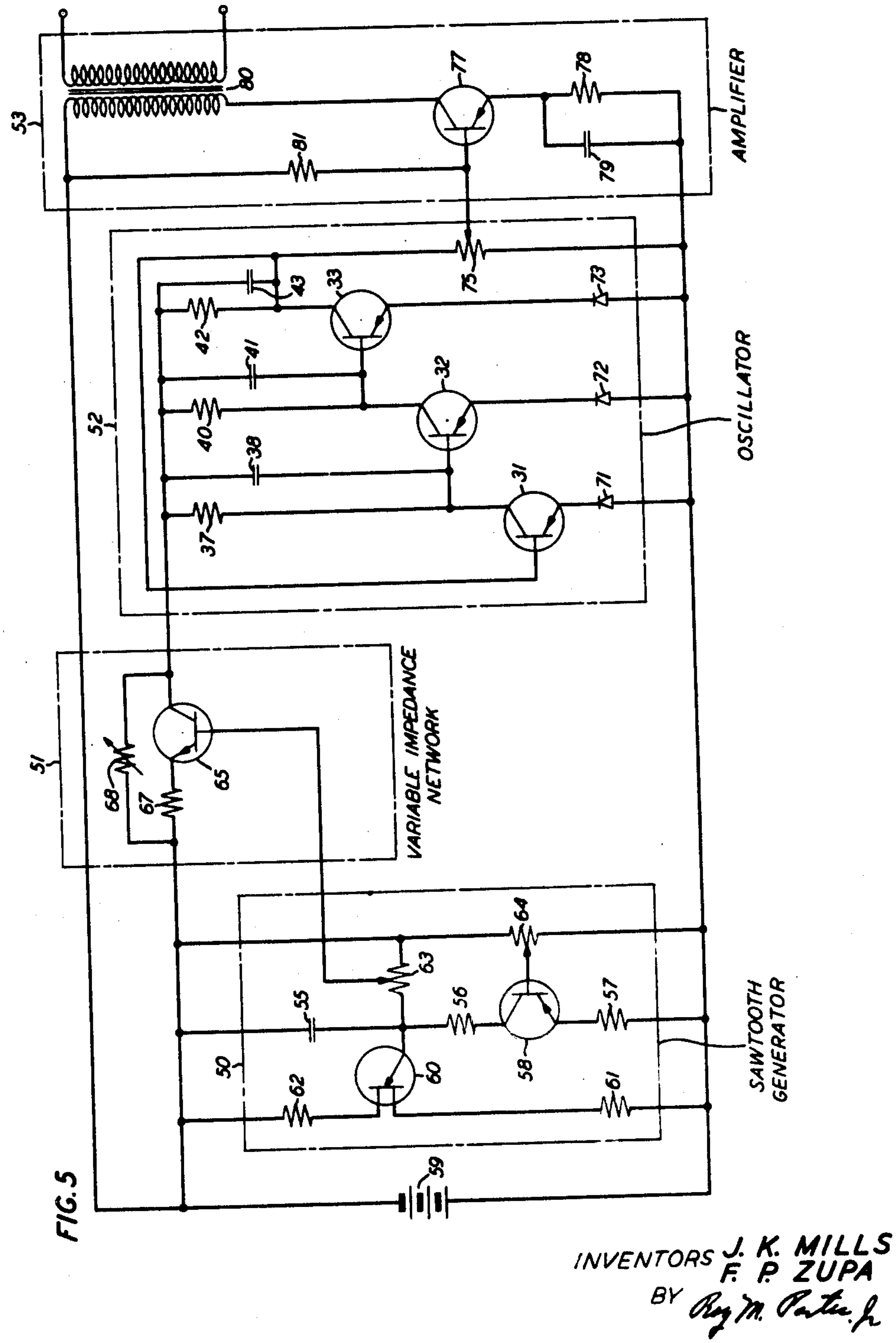
FIG. 5 is a schematic drawing of a sweep frequency generator which embodies the invention.

FIG. 5 of the drawings illustrates the application of the principles of the invention to produce a sweep frequency generator of improved design. The arrangement comprises a saw tooth generator 50, a variable impedance network 51, oscillator 52 and amplifier 53. The saw tooth generator 50 is made up of capacitor 55 which is serially connected with resistances 56 and 57, and the collector emitter path of transistor 58 across the terminals of battery 59. The interbase path of a unijunction transistor 60 is serially connected with resistances 61 and 62 across the terminals of battery 59, the emitter electrode of unijunction transistor 60 is connected to the juncture of capacitor 55 and resistance 56. A high resistance potentiometer 63 is connected between the emitter of unijunction transistor 60 and the negative terminal of battery 59, an additional potentiometer 64 is connected across the terminals of battery 59 and its movable tap is connected to the base electrode of transistor 58. The movable tap on potentiometer 63 forms the output for the saw tooth generator.

The unijunction transistor is a three terminal semiconductive device which is capable of operation resembling that of a gas thyratron. When the potential at its emitter terminal reaches a value which is a predetermined proportion of the potential existing across its base electrodes, the transistor "fires"—that is, conduction is initiated between its emitter and its more negative base electrode. During the operation of the saw tooth generator, capacitor 55 is charged by means of a current flowing through transistor 58. Since transistor 58 operates as a constant current source, the voltage across capacitor 55 rises linearly until it reaches the firing potential of unijunction transistor 60. At this time the capacitor immediately discharges through the unijunction device and through resistance 62. Resistance 62 is necessary to insure that high discharge currents do not damage the unijunction device. Having discharged, the capacitor 55 again charges linearly toward the firing voltage of the unijunction transistor and this charge-discharge cycle is repeated such that a linear saw tooth waveform is delivered to the base electrode of the transistor 65.

Current is supplied to the oscillator 52 by means of the variable impedance network 51. This network comprises the transconductive path of transistor 65, a fixed resistance 67, and variable resistance 68. When working in combination with the saw tooth generator 50, the variable impedance network 51 provides a cyclically varying input current to the oscillator 52. The oscillator 52 is identical to the oscillator discussed in conjunction with FIG. 4 of the drawings with the exception that transistors of opposite conductivity type are employed and that diodes 71, 72 and 73 are connected in series with the emitter electrodes of transistors 31, 32 and 33, respectively. Like reference numerals have been used in both FIGS. 4 and 5 to designate those components whose function is the same in both circuits.

The diodes 71, 72 and 73 are forward biased and exhibit a nonlinear resistance characteristic which is utilized to compensate for any inherent nonlinearity in the sweep frequency characteristics of the oscillator. It has been found experimentally that the use of forward-biased diodes provides a linear "input voltage v. frequency" characteristic over a wide frequency range.

The sinusoidal output from the oscillator is obtained from the movable tap of potentiometer 75 which is connected between the collector electrode of transistor 33 and positive terminal 59. The output from the oscillator is applied to a transistor amplifying arrangement which comprises transistor 77, emitter resistance 78, by-pass capacitor 79, output transformer 80 and base biasing resistor 81.

In operation the sweep frequency generator shown in FIG. 5 may be adjusted to perform in a variety of ways. By adjusting the potentiometer 63, it is possible to adjust the range of frequencies through which the oscillator sweeps during any given cycle. It may be adjusted, for example, to sweep an audio-frequency range of signals from 0 to 7,500 c.p.s. or, depending on the circuit parameters used, may operate into the megacycle range. By adjusting the movable tap on potentiometer 64, it is possible to adjust the rate at which capacitor 55 is charged and hence to adjust the sweep repetition rate. Adjustments of variable resistance 68 alter the lower limit of the sweep frequency and potentiometer 75 may be adjusted to vary the output amplitude delivered to the secondary terminals of transformer 80.

The embodiments of the invention which are herein disclosed are of course merely illustrative of the principles of the invention. Variations in the circuitry employed will be obvious to those skilled in the art without departing from the spirit and scope of the invention.

What is claimed is:

1. A variable-frequency oscillator which comprises, in combination, at least three transistors each having a base electrode and a collector-emitter path, a variable impedance source of a unidirectional potential, at least three resistors each being connected in series with one of said collector-emitter paths across said variable impedance source, the impedance of each of said resistors being substantially greater than the impedance presented by each of said collector-emitter paths and by said variable impedance source, a capacitor connected in parallel with each of said resistors, direct-coupling means for connecting the base electrode of each of said transistors to the junction of the collector-emitter path and the connected resistor of another of said transistors, said direct-coupling means interconnecting said transistors to form a ring of direct-coupled phase-shift amplifying stages, and means for varying the impedance of said variable impedance source to alter the discharge time constant of each of said capacitors whereby the frequency of oscillation of said oscillator is altered.

2. An oscillator of the type set forth in claim 1 characterized in that said variable impedance voltage source comprises a low impedance source of a unidirectional potential interconnected with a control transistor and said means for varying the magnitude of the impedance of said variable impedance source comprises a waveform generator for generating a control signal and means responsive to said control signal for varying the transconductive impedance of said control transistor.

3. An oscillator of the type set forth in claim 1 characterized in that said oscillator is provided with a plurality of outputs, each of said outputs comprising a direct connection to the juncture of the transconductive path and the connected capacitor of one of said transistors, the signals appearing on different ones of said outputs being displaced one from the other by a predetermined phase angle.

4. An oscillator of the type set forth in claim 1 characterized in that said oscillator is provided with interconnected nonlinear impedance means for obtaining a predetermined relationship between the frequency of oscillation and another parameter of operation.

References Cited in the file of this patent

UNITED STATES PATENTS

| | | |
|---|---|---|
| 2,492,184 | Royden | Dec. 27, 1949 |
| 2,671,856 | Cormack | Mar. 9, 1954 |
| 2,774,875 | Keonjan et al. | Dec. 18, 1956 |
| 2,916,706 | Timperman | Dec. 8, 1959 |